United States Patent

Ha

[11] Patent Number: 6,077,777
[45] Date of Patent: Jun. 20, 2000

[54] METHOD FOR FORMING WIRES OF SEMICONDUCTOR DEVICE

[75] Inventor: Jae Hee Ha, Chungcheongbuk-do, Rep. of Korea

[73] Assignee: LG Semicon Co., Ltd., Chungcheongbuk-do, Rep. of Korea

[21] Appl. No.: 08/927,204

[22] Filed: Sep. 11, 1997

[30] Foreign Application Priority Data

Dec. 31, 1996 [KR] Rep. of Korea ............. 96-79249

[51] Int. Cl.[7] ................................. H01L 21/44
[52] U.S. Cl. .................. 438/652; 438/652; 438/600; 437/187; 437/195
[58] Field of Search ......................... 438/652, 187, 438/195

[56] References Cited

U.S. PATENT DOCUMENTS 5,229,325  7/1993  Park et al. ................. 437/187
5,466,640  11/1995  Choi ........................ 437/195

OTHER PUBLICATIONS

Usujima et al, "Generation Mechanism of Photoresist Residue after Ashing," J. Electrochem. Soc., vol. 141, No. 9 (Sep. 1994) pp. 2487–2493.

*Primary Examiner*—David Nelms
*Assistant Examiner*—Pho Luu

[57] ABSTRACT

A method of forming wires of a semiconductor device is disclosed for improving the performance of the semiconductor device. The method includes the steps of successively forming a barrier layer, a wire layer and an antireflective coating layer on a semiconductor substrate, patterning the barrier layer, the wire layer and the ARC layer, and removing remainders produced during the patterning step by using a plasma including a mixture of oxygen ($O_2$) and a gas having fluorine, whereby over-etching of the wire layer and the semiconductor layer is prevented.

21 Claims, 2 Drawing Sheets

METHOD FOR FORMING WIRES OF SEMICONDUCTOR DEVICE

BACKGROUND OF THE INVENTION

1. Field of the Invention

The present invention relates to a method of fabricating a semiconductor device and, more particularly, to a method of forming wires of a semiconductor device suitable for improving the performance of the semiconductor device.

2. Discussion of the Related Art

When aluminum is used to form wires of a semiconductor device, it is first deposited and etched in a chlorine plasma. Then a post-treating process is performed to prevent aluminum corrosion. In the post-treating process, the deposited aluminum is dipped into a distilled water to remove chlorine, so that the wires formed with aluminum are protected from corrosion.

As an alternative way of preventing such an aluminum corrosion, an in-situ $H_2O$ vapor plasma is used to remove the chlorine. Most of aluminum etching equipments include an etching chamber and a $H_2O$ vapor cleaning/ashing chamber, so that a $H_2O$ vapor plasma can be used to prevent the corrosion without destroying the vacuum. When removing the chlorine in the $H_2O$ plasma cleaning process, however, a photoresist which is used to form an etching pattern is also removed by the H ions, O ions, and OH ions. In addition, the $H_2O$ plasma cleaning process chemically changes the material of the photoresist. As a result, a significant amount of polymer remainder remains on the wires made of aluminum or aluminum alloy, which is not removable with an $O_2$ ashing process. Accordingly, additional processes are needed to remove the polymer remainder.

To remove the polymer remainder, it has been suggested to use a wet etch employing a solution such as ACT or EKC which contains an amine group, or a strong acid liquid solution. However, such a chemical treatment causes over-etching and inaccurate patterning of the aluminum layer, deteriorating the performance of the semiconductor device.

A conventional method of forming wires of a semiconductor device, which employs the above described process, will be explained below with reference to the accompanying drawings, in order to illustrate the problems of the conventional method.

FIGS. 1a through 1d show cross-sectional views for explaining a conventional method of forming wires of a semiconductor device.

First, as shown in FIG. 1a, a barrier metal layer 12 is formed on an insulating layer 11. On the barrier metal layer 12, an aluminum layer 13 (or an aluminum alloy layer) is formed to be patterned as wires. An anti-reflective coating (ARC) layer 14 is formed on the aluminum layer 13, and a photoresist layer 15 is formed on the entire surface of the ARC layer 14. The photoresist layer 15 is subjected to an exposure and development process for patterning.

As shown in FIG. 1b, in a plasma containing chlorine, the ARC layer 14, the aluminum layer 13 and the barrier metal layer 12 are etched using the patterned photoresist layer 15 as a mask. Then an in-situ $H_2O$ vapor plasma cleaning process and an $O_2$ etching process are performed to remove the insulating layer 11 to a predetermined depth.

As shown in FIG. 1c, as the photoresist layer 15 is removed the remainder 15a is produced on the ARC layer 14. A chemical liquid solution containing an amine group or a strong acid solution containing a sulfuric acid or a nitric acid is used to remove the remainder 15a. After the remainder 15a is removed, a distilled water process, a spin dry process and an $N_2$ blowing process are performed.

As shown in FIG. 1d, when the above chemical treatment is performed, however, the aluminum layer 13 is over-etched because the etch rate of the ARC layer 14 is different from that of the aluminum layer 13. At the same time, the barrier metal layer 12 under the aluminum layer 13 is also over-etched, resulting in an inferior wiring pattern.

Accordingly, the conventional method of forming wires of a semiconductor device has problems including the following.

First, an extra bath is required because a chemical solution is used to remove photoresist/polymer remainders.

Second, because a wet etch using a chemical solution is performed to remove polymer remainders, the process time for forming the wires increases and the wires are further over-etched, deteriorating the performance of the semiconductor device having such wires.

SUMMARY OF THE INVENTION

Therefore, the present invention is directed to a method of forming wires of a semiconductor device that substantially obviates one or more problems due to limitations and disadvantages of the related art.

An object of the invention is to provide a method of forming wires of a semiconductor device wherein the process time is reduced by eliminating the use of an extra equipment, so as to improve the performance of the semiconductor device.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the method of forming wires of a semiconductor device includes the steps of successively forming a barrier layer, a conductive layer, and an ARC layer on a semiconductor substrate; patterning the barrier layer, the conductive layer, and the ARC layer; and removing remainders produced during the patterning step by using a plasma containing oxygen and a gas having fluorine.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 2a through 2d show cross-sectional views for explaining a method of forming wires of a semiconductor device according to the embodiments of the invention.

Figure 1A:
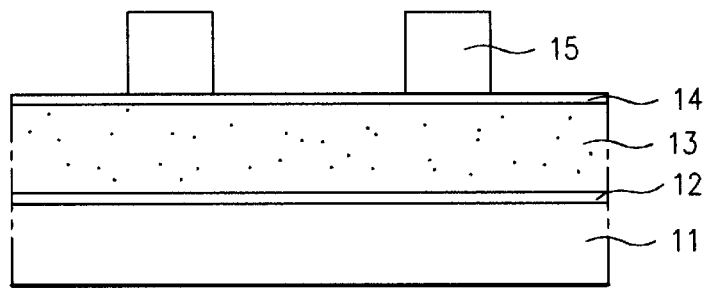
FIGS. 1a through 1d are cross-sectional views for illustrating process steps of a conventional method for forming wires of a semiconductor device.
Figure 1B:
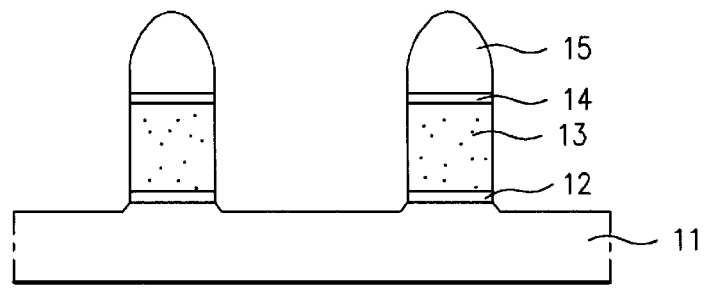
Figure 1C:
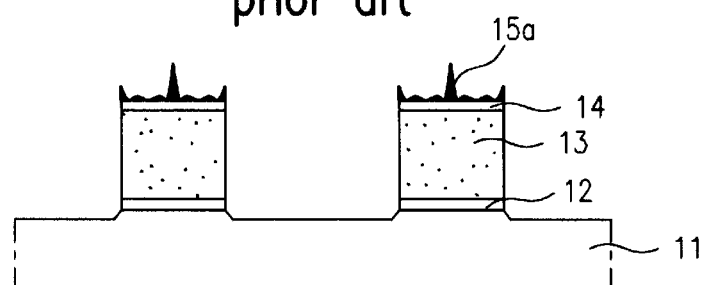
Figure 1D:
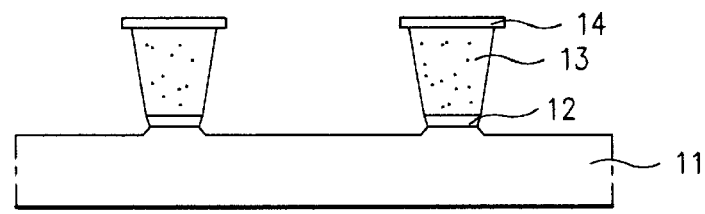
Figure 2A:
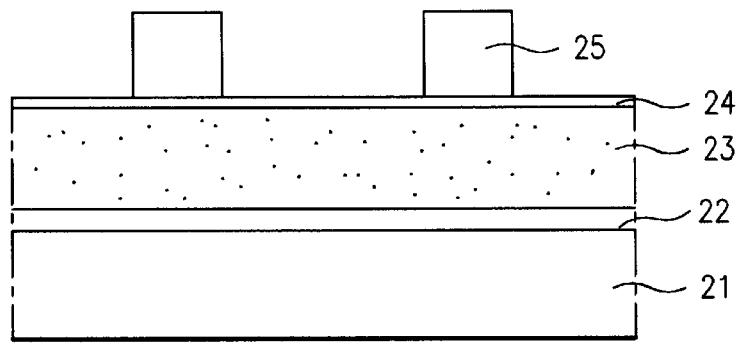
FIGS. 2a through 2d are cross-sectional views for illustrating process steps of a method for forming wires of a semiconductor device according to the preferred embodiments of the invention.

Referring to FIG. 2a, a barrier metal layer 22 which is made of titanium (Ti), titanium nitride (TiN), Ti/TiN, or titanium tungsten (TiW), is formed on an insulating layer 21. On the barrier metal layer 22, an aluminum layer 23 (or an aluminum alloy layer) and an ARC layer 24 are successively formed. The ARC layer 24 may be formed with TiN. A photoresist layer 25 is then coated on the ARC layer 24 and patterned using exposure and development process.

Figure 2B:
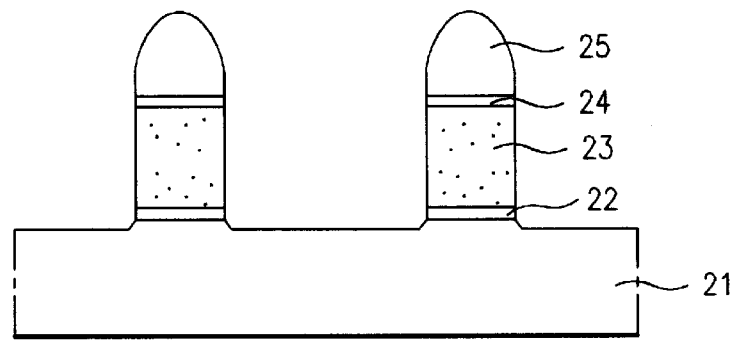

Referring to FIG. 2b, using the patterned photoresist layer 25 as a mask, the ARC layer 24, the aluminum layer 23 and the barrier metal layer 22 are successively etched. For the etching process, one of etching equipments, e.g. a reactive ion etching (RIE) type equipment, an inductive coupled plasma (ICP) type equipment, or a Helicon type equipment, is used in a chlorine plasma. When the etch process is performed in the chlorine plasma, the insulating layer 21 is also etched to a predetermined depth, which forms a projected portion 21a of the insulating layer 21 under the barrier metal layer 22.

Figure 2C:
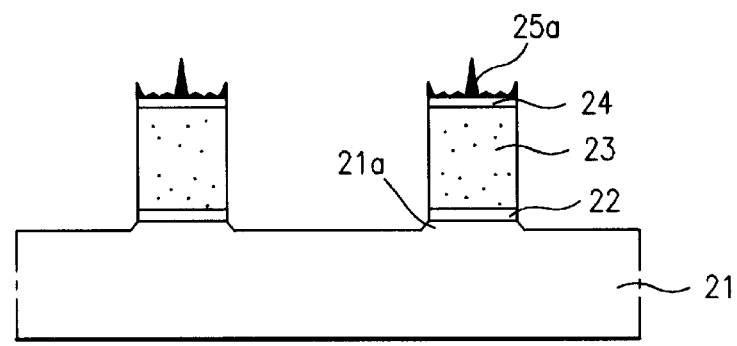

Referring to FIG. 2c, after the etch process is performed in the chlorine plasma, an in-situ $H_2O$ vapor plasma cleaning process is performed. In the cleaning process, a hardened remainder 25a composed of carbon, oxygen, aluminum and a small amount of silicon is formed on the ARC layer 24.

The projected portion 21a of the insulating layer 21 located directly under the barrier metal layer 22 is patterned to have a width greater than the width of the barrier metal layer 22. That is, at each side, the projected portion 21a of the insulating layer 21 extends 300 Angstroms–400 Angstroms more than the barrier metal layer 22. Therefore the total difference between the width of the projected portion 21a of the insulating layer 21 and the width of the barrier metal layer 22 is 600–800 Angstroms.

Figure 2D:
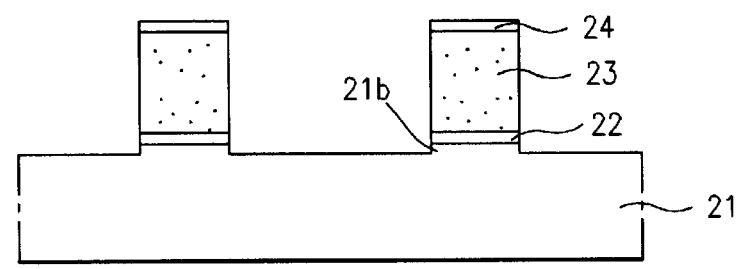

Referring to FIG. 2d, a plasma including a mixture of $O_2$ and a gas having fluorine, such as $CF_4$ or $CHF_3$, is used with a Helicon type high density etching equipment to remove the remainder 25a. The conditions for removing the remainder 25a by employing the high density etching equipment are as follows: the etching time is less than or equal to 60 seconds; the chamber pressure is in the range of 6–10 mT; the flow rate of $O_2$ and the gas having fluorine is in the range of 8:1–10:1; the power source is in the range of 2300 W–2800 W; and the bias power is the range of 350–450 W.

According to the method of forming wires of a semiconductor device of the invention, over-etching of the aluminum layer 23 and the barrier metal layer 22 during the process of removing the remainder 25a is prevented, because the aluminum layer 23 is not etched by the gas having fluorine used in removing the remainder 25a. Further, since the aluminum layer 23 and the barrier metal layer 22 are not over-etched, over-etching of the projected portion 21a of the insulating layer 21 is simultaneously minimized.

When the plasma of the mixture of $O_2$ and the gas having fluorine, e.g. $CF_4$ and $CHF_3$, is used to remove the remainder 25a, the end portions of the projected portion 21a are also removed so that the insulating layer 21 is etched at a right angle to the barrier metal layer 22, as shown in FIG. 2d. This allows the width of the etched portion 21b of the insulating layer 21 to be the same or substantially the same as the width of the barrier metal layer 22. The removal amount for the insulating layer 21 can be adjusted by adjusting the etching conditions employed for etching the aluminum layer 23 and the barrier metal layer 22.

Accordingly, a method of forming wires of a semiconductor device of the invention has advantages including the following.

First, the production cost is reduced because extra equipments are not needed to remove photoresist/polymer remainders.

Second, since a chemical solution is not used to remove the remainders, over-etching of wires is prevented and the process time is considerably decreased.

Third, because a chemical solution is not used to remove the remainders, the loss or over-etching of an insulating layer below the barrier metal layer is minimized.

It will be apparent to those skilled in the art that various modification and variations can be made in the method for forming wires of a semiconductor device of the present invention without departing from the spirit or scope of the inventions. Thus, it is intended that the present invention cover the modifications and variations of this invention provided they come within the scope of the appended claims and their equivalents.

What is claimed is:

1. A method of forming wires of a semiconductor device, comprising:

successively forming a barrier layer, a conductive layer, and an anti-reflective coating (ARC) layer on a semiconductor substrate;

patterning the barrier layer, the conductive layer, and the ARC layer; and removing remainders produced during the patterning step by dry etching.

2. The method as claimed in claim 1, wherein the barrier layer is made of one of titanium (Ti), titanium nitride (TiN), Ti/TiN, and titanium tungsten (TiW).

3. The method as claimed in claim 1, wherein the conductive layer is one of an aluminum (Al) layer and an aluminum alloy layer.

4. The method as claimed in claim 1, wherein the ARC layer is made of TiN.

5. The method as claimed in claim 1, wherein the patterning step is performed using an etching gas having chlorine (Cl).

6. The method as claimed in claim 1, further comprising the step of:

performing a $H_2O$ vapor plasma cleaning process after the patterning step.

7. The method as claimed in claim 1, wherein the gas having fluorine is one of $CF_4$ and $CHF_3$.

8. The method as claimed in claim 1, wherein the removing step is performed under the following condition:

a flow rate of $O_2$ and the gas having fluorine is approximately 8:1–10:1.

9. The method as claimed in claim 1, wherein the removing step is performed using a power source providing approximately 2300 W–2800 W.

10. The method as claimed in claim 1, wherein the removing step is performed using a bias power of approximately 350 W–450 W.

11. The method as claimed in claim 1, wherein the removing step is performed using a chamber pressure of approximately 6 mT–10 mT.

12. The method as claimed in claim 1, wherein the removing step is performed under the following condition:

an etching time of less than or equal to 60 seconds.

13. The method as claimed in claim 1, wherein the patterning step is performed with one of a reactive ion etching (RIE) type equipment, an inductive coupled plasma (ICP) type equipment, and a Helicon type equipment.

14. The method as claimed in claim 1, wherein the removing step is performed using a Helicon type high density etching equipment.

15. The method as claimed in claim 1, wherein the patterning step includes the steps of:

forming a photoresist pattern on the ARC layer, and removing portions of the barrier layer, the conductive layer, and the ARC layer using the photoresist pattern as a mask.

16. The method as claimed in claim 1, further comprising the step of:

removing portions of the semiconductor substrate during the patterning step so as to form a first portion of the semiconductor substrate under the patterned barrier layer.

17. The method as claimed in claim 16, wherein a difference between a width of the patterned barrier layer and a width of the first portion of the semiconductor substrate is approximately 600–800 Angstroms.

18. The method as claimed in claim 16, further comprising the step of:

selectively removing the first portion of the semiconductor substrate during the remainder removing step, using the plasma, so as to form a second portion of the semiconductor substrate.

19. The method as claimed in claim 18, wherein sides of the second portion of the semiconductor substrate form substantially a right angle with a top surface of the semiconductor substrate.

20. The method as claimed in claim 1, wherein the remainders include at least one of carbon, oxygen, aluminum, and silicon.

21. The method as claimed in claim 1, wherein the dry etching is performed by using a plasma containing oxygen ($O_2$) and a gas having fluorine.

* * * * *